United States Patent
Lin et al.

(10) Patent No.: US 8,101,447 B2
(45) Date of Patent: Jan. 24, 2012

(54) LIGHT EMITTING DIODE ELEMENT AND METHOD FOR FABRICATING THE SAME

(75) Inventors: Hung-Cheng Lin, Taipei County (TW); Chia-Ming Lee, Yilan County (TW); Jen-Inn Chyi, Taoyuan County (TW)

(73) Assignee: Tekcore Co., Ltd., Nantou (TW)

( * ) Notice: Subject to any disclaimer, the term of this patent is extended or adjusted under 35 U.S.C. 154(b) by 897 days.

(21) Appl. No.: 11/961,478

(22) Filed: Dec. 20, 2007

(65) Prior Publication Data

US 2009/0159870 A1   Jun. 25, 2009

(51) Int. Cl.
*H01L 33/20* (2010.01)

(52) U.S. Cl. ............. 438/44; 438/22; 438/29; 438/31; 438/41; 438/42; 438/700; 438/701; 438/733

(58) Field of Classification Search ............. 257/79–103; 438/22–47, 689–757
See application file for complete search history.

(56) References Cited

U.S. PATENT DOCUMENTS

| | | | |
|---|---|---|---|
| 3,998,672 A * | 12/1976 | Miyoshi et al. | 438/43 |
| 6,229,160 B1 | 5/2001 | Krames et al. | |
| 6,562,642 B1 * | 5/2003 | Cohen et al. | 438/22 |
| 6,635,901 B2 * | 10/2003 | Sawaki et al. | 257/80 |
| 6,768,136 B2 | 7/2004 | Eisert et al. | |
| 6,828,591 B2 * | 12/2004 | Okuyama et al. | 257/89 |
| 6,844,572 B2 * | 1/2005 | Sawaki et al. | 257/94 |
| 7,601,621 B2 * | 10/2009 | Choi et al. | 438/518 |
| 7,781,246 B2 * | 8/2010 | Kim et al. | 438/43 |
| 2002/0124794 A1 * | 9/2002 | Sakai et al. | 117/84 |
| 2008/0308835 A1 * | 12/2008 | Pan | 257/103 |
| 2009/0032799 A1 * | 2/2009 | Pan | 257/13 |

FOREIGN PATENT DOCUMENTS

TW   565957   12/2003

* cited by examiner

*Primary Examiner* — Kiesha Bryant
*Assistant Examiner* — Eric Ward
(74) *Attorney, Agent, or Firm* — Muncy, Geissler, Olds & Lowe, PLLC

(57) ABSTRACT

The present invention discloses a light emitting diode (LED) element and a method for fabricating the same, which can promote light extraction efficiency of LED, wherein a substrate is etched to obtain basins with inclined natural crystal planes, and an LED epitaxial structure is selectively formed inside the basin. Thereby, an LED element having several inclines is obtained. Via the inclines, the probability of total internal reflection is reduced, and the light extraction efficiency of LED is promoted.

7 Claims, 10 Drawing Sheets

LIGHT EMITTING DIODE ELEMENT AND METHOD FOR FABRICATING THE SAME

FIELD OF THE INVENTION

The present invention relates to a light emitting diode element and a method for fabricating the same, particularly to a high light-extraction efficiency light emitting diode element and a method for fabricating the same.

BACKGROUND OF THE INVENTION

Traditionally, a light emitting diode (LED) is fabricated into a parallelepiped shape. An LED usually has a small total reflection critical angle because there is a great difference between the refractive indexes of a semiconductor and a packaging material. The light generated by LED reaching an interface by an angle greater than the total reflection critical angle will be totally reflected back to the interior of the LED chip. Besides, the parallel faces of a parallelepiped decrease the probability that light leaves a semiconductor from an interface. Thus, photons can only be totally reflected inside a chip until they are completely absorbed and converted into heat. Therefore, LED usually has insufficient light efficiency.

Changing LED shape is an effective approach to improve LED light efficiency. In a U.S. Pat. No. 6,229,160, HP and LumiLeds Co. disclosed a "Truncated Inverted Pyramid (TIP)" LED, wherein four faces of an AlGaInP/GaP LED chip is mechanically fabricated to be no more parallel to each other. Thus, the external quantum efficiency thereof is greatly increased to 55%, and the light efficiency thereof can reach as high as 100 lm/W. The TIP LED is the first LED achieving the above mentioned standard. However, the technology of TIP LED can only apply to red light AlGaInP/GaP LED chips. A gallium nitride (GaN) LED is epitaxially grown on a sapphire substrate, which is very hard to mechanically fabricate. Therefore, the TIP LED technology cannot apply to GaN LED.

A U.S. Pat. No. 6,768,136 disclosed a LED using a SiC or GaN substrate, which can be fabricated more easily than sapphire. Thus, LED chips can be mechanically fabricated to change their shapes and promote light efficiency. Thereby, the light efficiencies of InGaN LED and GaN LED can be doubled. However, the prices of SiC substrates and GaN substrates are very high. Therefore, this technology is hard to commercialize.

A R.O.C. patent publication No. 565957 disclosed a "Hydride Vapor Phase Epitaxy (HVPE)", wherein a thick-film GaN epitaxial layer with inclined natural planes is formed on a substrate, and LED crystal is then formed on the substrate with a MOCVD (Metal Organic Chemical Vapor Deposition) technology. Thereby, LED has a higher light efficiency. This technology indeed solves the problems of mechanical fabrication and substrate price. However, it has the disadvantages of needing two epitaxial processes, which make LED fabrication more complicated.

SUMMARY OF THE INVENTION

The present invention provides a LED (Light Emitting Diode) element and a method for fabricating the same, wherein a substrate is etched to form basins having inclined natural crystal planes, and LED epitaxial layers are selectively grown inside the basins to obtain a multi-incline LED without using any mechanical fabrication process or secondary epitaxial process.

The method for fabricating an LED element of the present invention comprises (a) providing a substrate, forming a passivation layer on the substrate and defining a plurality of polygonal etch areas, wherein the substrate may be made of sapphire, silicon carbide (SiC), silicon (Si), gallium arsenide (GaAs) or aluminum nitride (AlN), wherein the passivation layer has a width of between 5 and 50 microns, and wherein the etch area has an inner diameter of between 200 and 2000 microns and may have a shape of a rectangle, circle, triangle, star, or polygon; (b) etching the substrate to form on the etch areas a plurality of basins having inclined natural crystal planes and a bottom plane, wherein the basin has a depth of between 0.5 and 50 microns, wherein the etching time may be prolonged until the passivation layer is all removed, and wherein the bottom plane of the basin may be pattern-etched to form a rugged surface for increasing light extraction efficiency; (c) forming an LED structure on the bottom plane of the basin via epitaxially growing on the basin an n-type III-V group compound layer, an active layer and a p-type III-V group compound layer in sequence, wherein the active layer is interposed between the n-type III-V group compound layer and the p-type III-V group compound layer and functions as a light emitting zone, and wherein for providing a forward bias, a p-type ohmic contact electrode is electrically coupled to the p-type III-V group compound layer, and an n-type ohmic contact electrode is electrically coupled to the n-type III-V group compound layer; and (d) grinding the substrate, cutting and splitting the ground substrate into LED chips.

The light emitting diode element fabricated according to the above mentioned method comprises: a substrate and a LED structure. The substrate is etched to form basins having inclined natural crystal planes and a bottom plane. The LED structure is formed on the bottom plane of the basin via epitaxially growing on the bottom plane an n-type III-V group compound layer, an active layer and a p-type III-V group compound layer in sequence. The active layer is interposed between the n-type III-V group compound layer and the p-type III-V group compound layer and functions as a light emitting zone. For providing a forward bias, a p-type ohmic contact electrode is electrically coupled to the p-type III-V group compound layer, and an n-type ohmic contact electrode is electrically coupled to the n-type III-V group compound layer.

The active layer may be a dual heterogeneous (DH) junction structure, a single quantum well (SQW) structure or a multiple quantum well (MQW) structure.

Further, the LED structure may be electrically coupled to a heat dissipation/reflection substrate via the p-type ohmic contact electrode and the n-type ohmic contact electrode. The heat dissipation/reflection substrate includes a reflective metal layer and a heat-conduction substrate. One surface of the reflective metal layer is electrically coupled to the LED structure, and the other surface is connected to the heat-conduction substrate. The material of the reflective metal layer is selected from the group consisting of gold (Au), aluminum (Al), copper (Cu), etc.; alternatively, the material of the reflective metal layer may also be one combination of the above mentioned materials. The material of the heat-conduction substrate is selected from the group consisting of gold (Au), aluminum (A), copper (Cu), silicon (Si), gallium phosphide (GaP), silicon carbide (SiC), etc.; alternatively, the material of the heat-conduction substrate may also be one combination of the above mentioned materials.

The present invention also provides another method for fabricating a LED element, wherein the substrate is removed, which comprises (a) providing a substrate, forming a passivation layer on the substrate and defining a plurality of polygonal etch areas; (b) etching the substrate to form on the etch areas a plurality of basins having inclined natural crystal planes and a bottom plane, and pattern-etching the bottom plane to form a rugged surface; (c) forming a LED structure on the bottom plane via epitaxially growing on the bottom plane an n-type III-V group compound layer, an active layer and a p-type III-V group compound layer in sequence, wherein the active layer is interposed between the n-type III-V group compound layer and the p-type III-V group compound layer and functions as a light emitting zone; (d) vapor-depositing a p-type ohmic contact metal layer on the p-type III-V group compound layer, and connecting the p-type ohmic contact metal layer with a heat-conduction substrate, wherein the material of the heat-conduction substrate is selected from the group consisting of gold (Au), aluminum (Al), copper (Cu), silicon (Si), gallium phosphide (GaP), silicon carbide (SiC), etc.; alternatively, the material of the heat-conduction substrate may also be one combination of the above mentioned materials; (e) removing the substrate with a wet-etching method, a dry-etching method, a laser lift off method, or a method of using different thermal expansion coefficients, wherein the substrate will be spontaneously separated from the LED structure during temperature variation; (f) vapor-depositing an n-type ohmic contact metal layer on the n-type III-V group compound layer; and (g) cutting and splitting the LED structure into LED chips.

The light emitting diode element with the substrate removed fabricated according to the above mentioned method comprises: an LED structure having inclines, wherein the LED structure having inclines is formed via etching a substrate to obtain basins having inclined natural crystal planes and a bottom plane, and epitaxially growing on the bottom plane an n-type III-V group compound layer, an active layer and a p-type III-V group compound layer in sequence, and wherein the active layer is interposed between the n-type III-V group compound layer and the p-type III-V group compound layer and functions as a light emitting zone; a p-type ohmic contact metal layer formed on the p-type III-V group compound layer; a heat-conduction substrate connected with the surface of the p-type ohmic contact metal layer; and an n-type ohmic contact metal layer formed on the n-type III-V group compound layer.

The n-type III-V group compound layer of the above mentioned LED element has a rugged surface.

The present invention is superior in being a multi-incline LED, which is formed via etching a substrate to obtain basins having inclined natural crystal planes and selectively growing LED epitaxial layers inside the basins. Via multiple inclines, the probability of total internal reflection is reduced, and the light extraction efficiency of LED is promoted. Further, the simple fabrication process of the present invention is favorable for mass production and can reduce the cost.

DETAILED DESCRIPTION OF THE PREFERRED EMBODIMENTS

The technical contents of the present invention are to be described in detail with embodiments. However, these embodiments are only to demonstrate the present invention but not to limit the scope of the present invention.

The present invention utilizes an etching technology to form basins with inclined natural crystal planes on a substrate. Epitaxial layers of LED are selectively grown in the basins to form an LED with several inclined planes. Thereby, a high light-extraction efficiency LED is achieved.

Figure 1A:
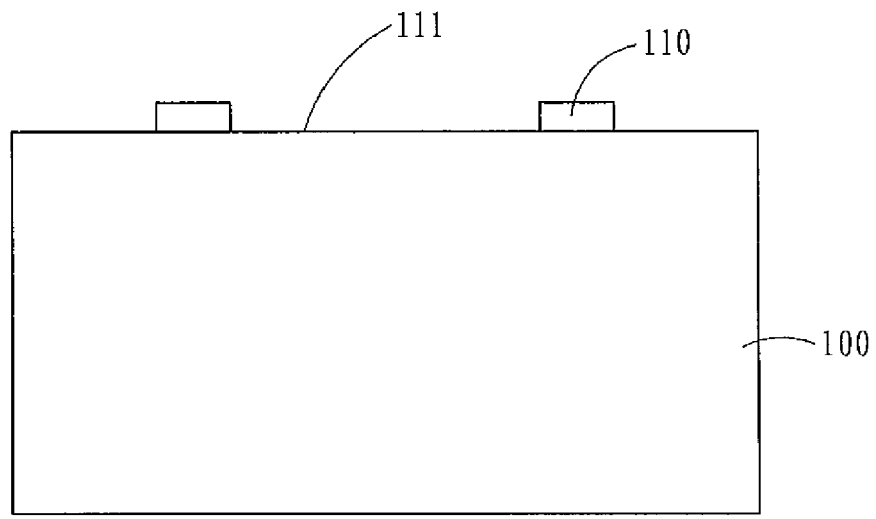
FIG. 1A to FIG. 1E are diagrams schematically showing the process of a method for fabricating an LED element according to the present invention.
Figure 1B:
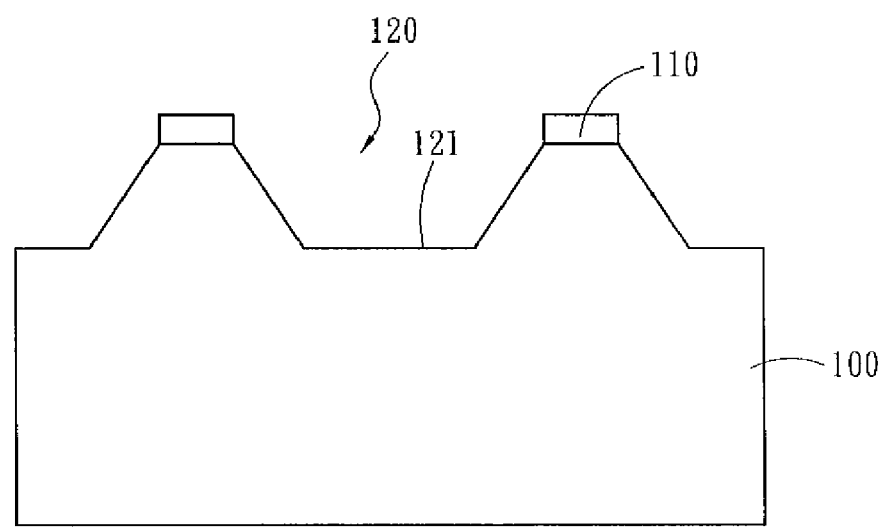

Refer to from FIG. 1A to FIG. 1E diagrams schematically showing the process of a method according to the present invention. The method of the present invention comprises the following steps:

(a) providing a substrate 100, forming a passivation layer 110 on the substrate 100 and defining a plurality of polygonal etch areas 111, as shown in FIG. 1A, wherein the substrate 100 may be made of sapphire, silicon carbide (SiC), silicon (Si), gallium arsenide (GaAs) or aluminum nitride (AlN), and wherein the passivation layer 110 has a width of between 5 and 50 microns, and wherein the etch area 111 has an inner diameter of between 200 and 2000 microns and may have a shape of a rectangle, circle, triangle, star, or polygon;

(b) etching the substrate 100 to form on the etch areas 111 a plurality of basins 120 with several inclined natural crystal planes and a bottom plane 121, as shown in FIG. 1B, wherein the basin 120 has a depth of between 0.5 and 50 microns; (Recently, the etching technology for a sapphire substrate has been extensively studied, and etching sapphire is no more a hard work. In the present invention, a substrate, such as a sapphire substrate, is etched to form a basin 120 with inclined natural crystal planes. A wet etching solution of sulfuric acid: phosphoric acid=5:2, which is heated to 270° C., can be used to etch a sapphire substrate. When the direction of the passivation layer 110 is parallel to the plane of a sapphire substrate, the substrate can be etch to obtain symmetric composite junctions, and an about 43° angle is contained by the composite junction and the bottom plane 121. When the direction of the passivation layer 110 is vertical to the plane of a sapphire substrate, the substrate can be etch to obtain an inclined natural crystal plane and a composite inclined natural crystal plane, wherein an about 32° angle is contained by the inclined natural crystal plane and the bottom plane 121, and an about 60° angle is contained by the composite plane and the bottom plane 121.)

Figure 1C:
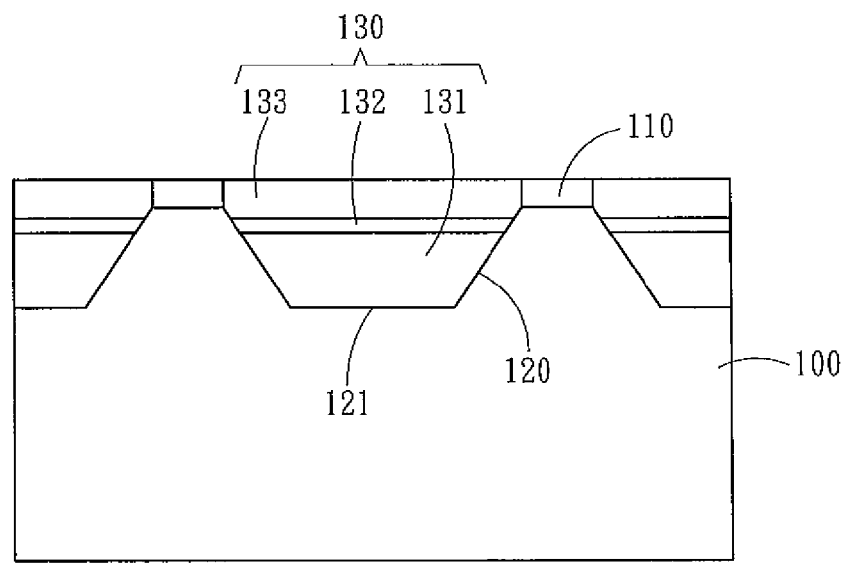
Figure 1D:
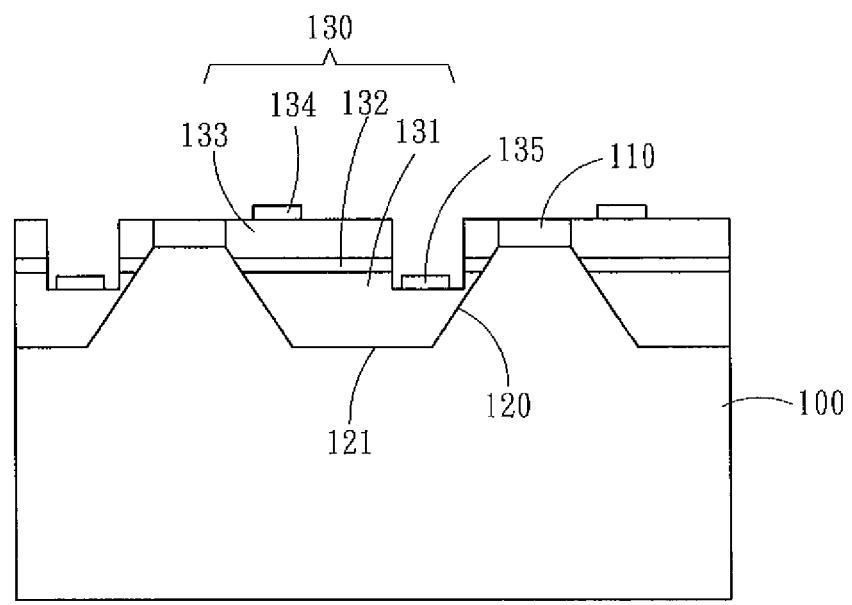

(c) forming an LED structure 130 on the bottom plane 121 of the basin 120, wherein the LED structure 130 comprises: an n-type III-V group compound layer 131, an active layer 132 and a p-type III-V group compound layer 133, which are sequentially and selectively grown with an MOCVD (Metal Organic Chemical Vapor Deposition) epitaxial method (as shown in FIG. 1C), and wherein the active layer 132 is interposed between the n-type III-V group compound layer 131 and the p-type III-V group compound layer 133 and functions as a light emitting zone; (The LED structure 130 will neither grow on the natural crystal planes formed by etching nor grow on the passivation layer 110 along the perimeter of the basin 120 but only selectively grow on the bottom plane 121 of the basin 120. Then, a dry etching is used to define a p-type ohmic contact electrode 134 and an n-type ohmic contact electrode 135, wherein the p-type ohmic contact electrode 134 is electrically coupled to the p-type III-V group compound layer 133, and the n-type ohmic contact electrode 135 is electrically coupled to the n-type III-V group compound layer 131, as shown in FIG. 1D. Thereby, a forward bias can be applied.)

Figure 1E:
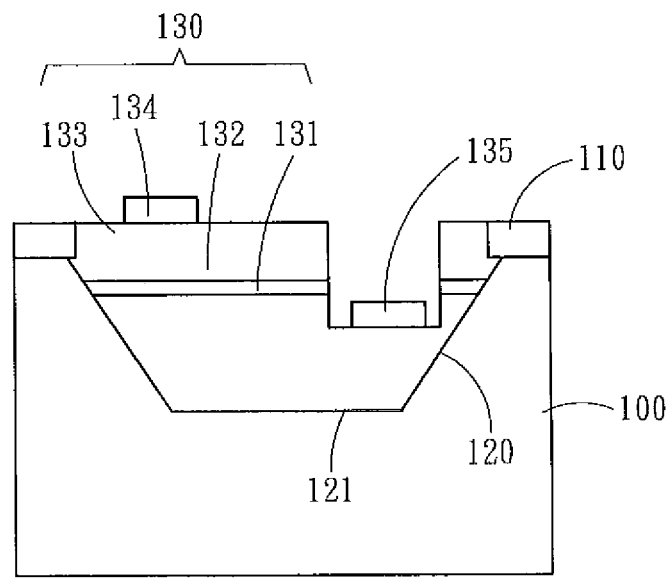

(d) grinding the substrate 100, cutting and splitting the ground substrate 100 into LED chips, as shown in FIG. 1E.

The light emitting diode element fabricated according to the above mentioned method (shown in FIG. 1E) comprises: a substrate 100 and an LED structure 130. The substrate 100 is etched to form basins 120 having inclined natural crystal planes and a bottom plane 121. The LED structure 130 is formed via epitaxially growing on the bottom plane 121 of the basin 120 an n-type III-V group compound layer 131, an active layer 132 and a p-type III-V group compound layer 133 in sequence, wherein the active layer 132 is interposed between the n-type III-V group compound layer 131 and the p-type III-V group compound layer 133 and functions as a light emitting zone. The active layer 132 may be a dual heterogeneous (DH) junction structure, a single quantum well (SQW) structure or a multiple quantum well (MQW) structure. For providing a forward bias, a p-type ohmic contact electrode 134 is electrically coupled to the p-type III-V group compound layer 133, and an n-type ohmic contact electrode 135 is electrically coupled to the n-type III-V group compound layer 131.

Figure 2A:
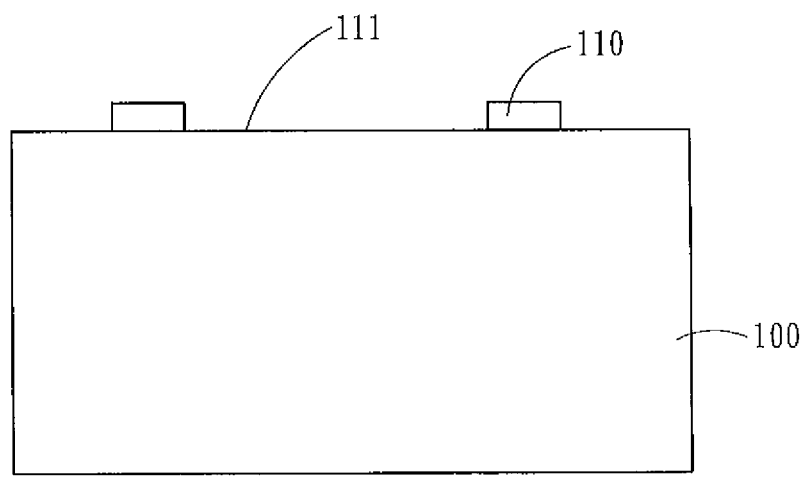
FIG. 2A to FIG. 2E are diagrams schematically showing the process of a method for fabricating an LED element without a passivation layer according to the present invention.
Figure 2B:
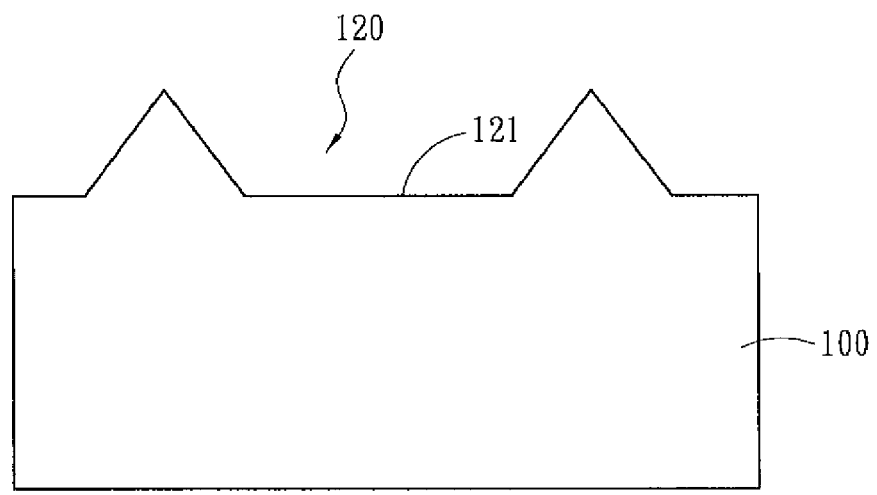
Figure 2C:
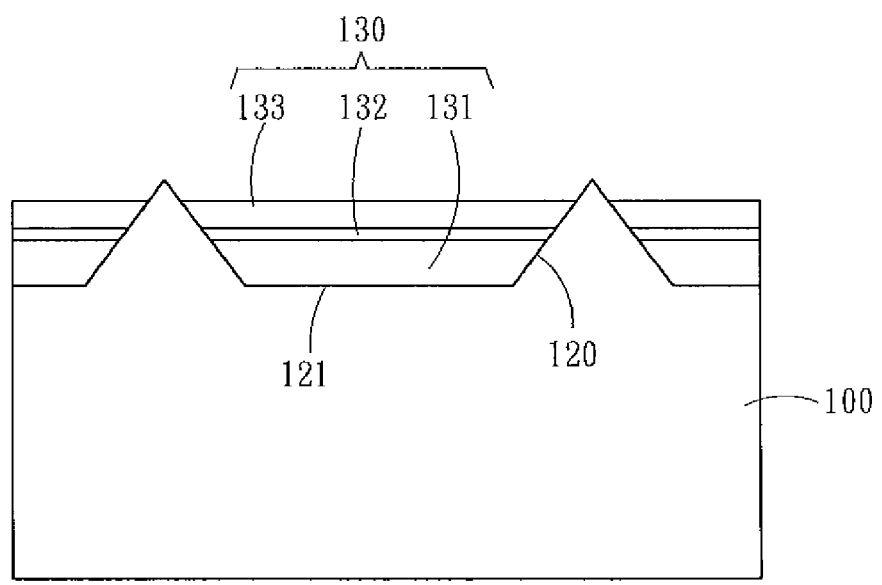
Figure 2D:
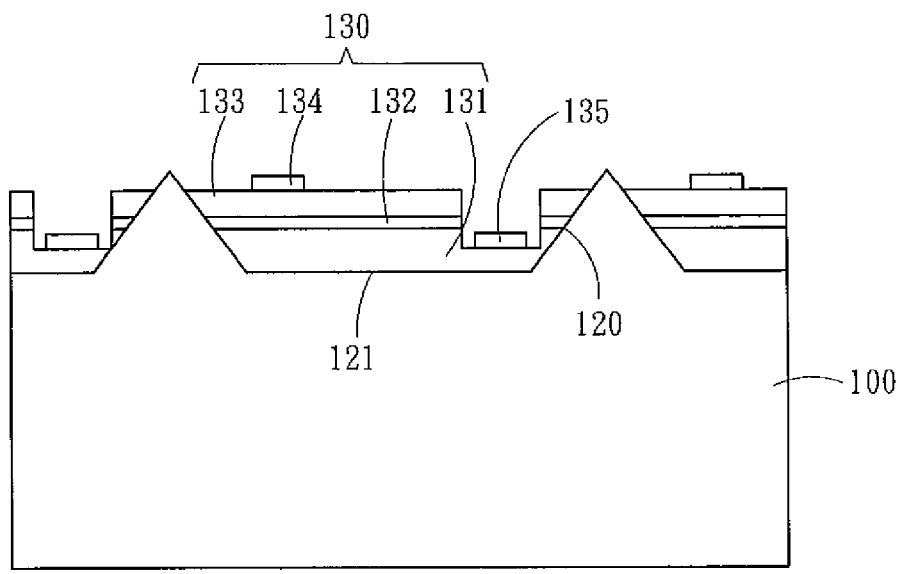
Figure 2E:
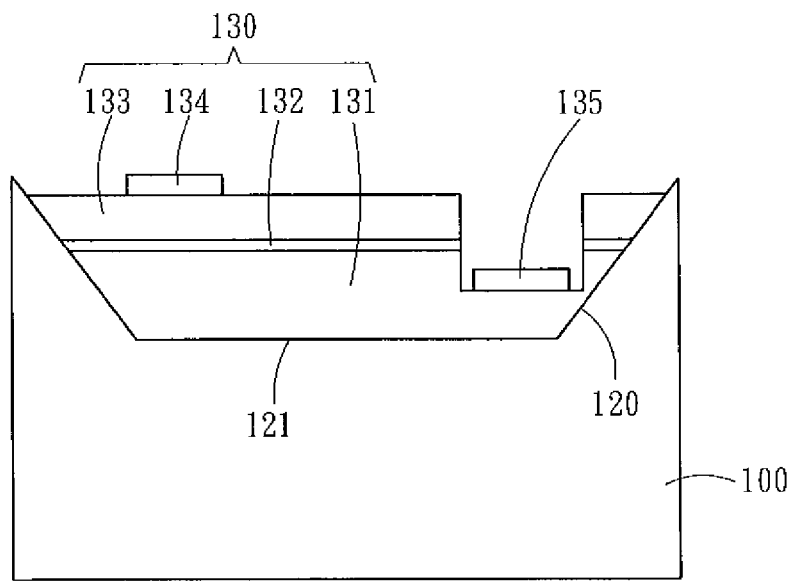

Refer to from FIG. 2A to FIG. 2E diagrams schematically showing the process of another method according to the present invention. In this method of the present invention, etching can be prolonged until the passivation layer 110 is all removed. This method is basically similar to the above mentioned method. In Step (b) of this method, the etch areas 111 are etched to obtain a plurality of basins 120 having inclined natural crystal planes and a bottom plane 121, but etching time is prolonged until the passivation layer 110 is all removed, as shown in FIG. 2B. The succeeding Step (c) (shown in FIG. 2C and FIG. 2D) and Step (d) (shown in FIG. 2E) of this method are identical to those of the above mentioned method. However, the diced LED chip shown in FIG. 2E is different from that shown in FIG. 1E in that none passivation layer 110 remains in the perimeter of the basin 120 of the substrate 100.

Figure 3A:
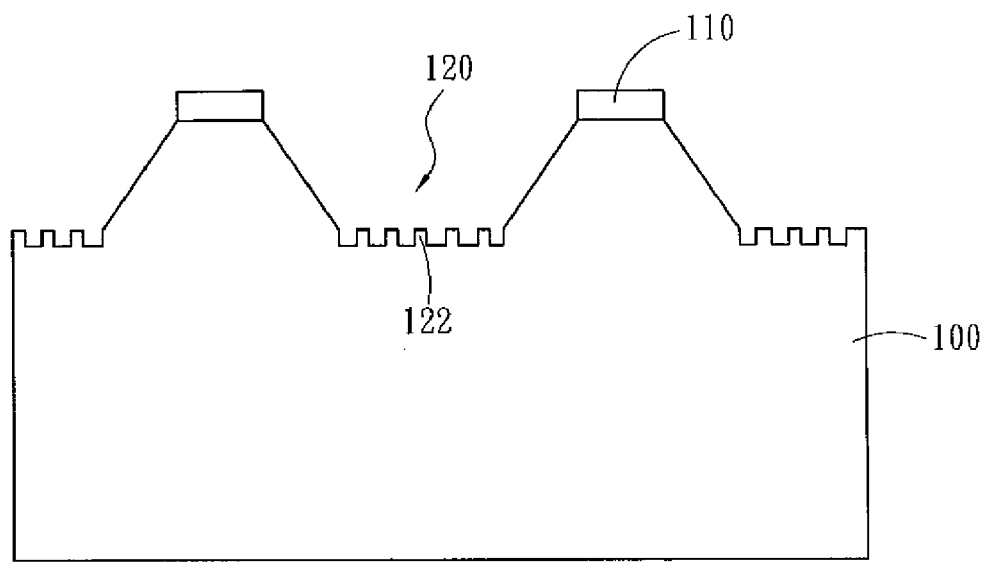
FIG. 3A to FIG. 3D are diagrams schematically showing the process of a method for fabricating an LED element with a rugged surface according to the present invention.
Figure 3B:
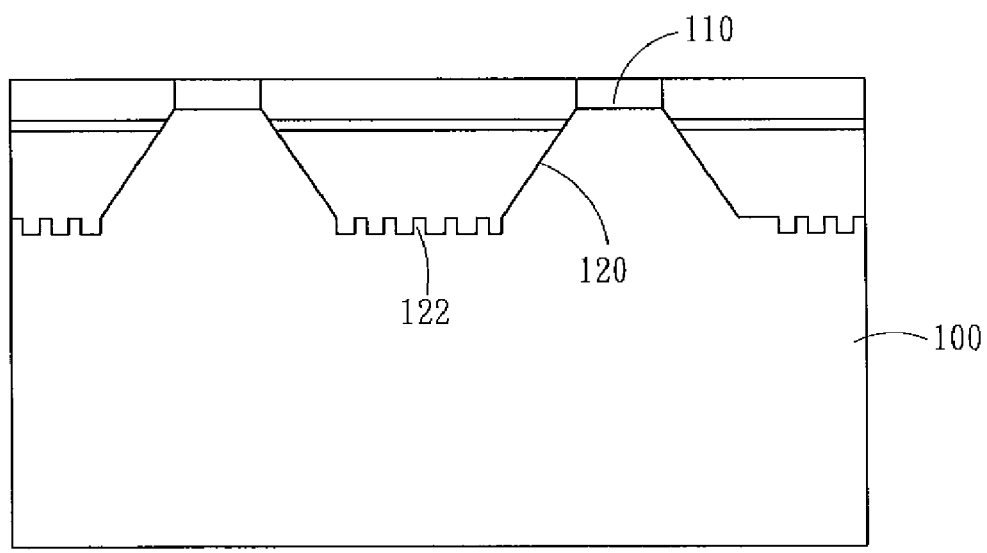
Figure 3C:
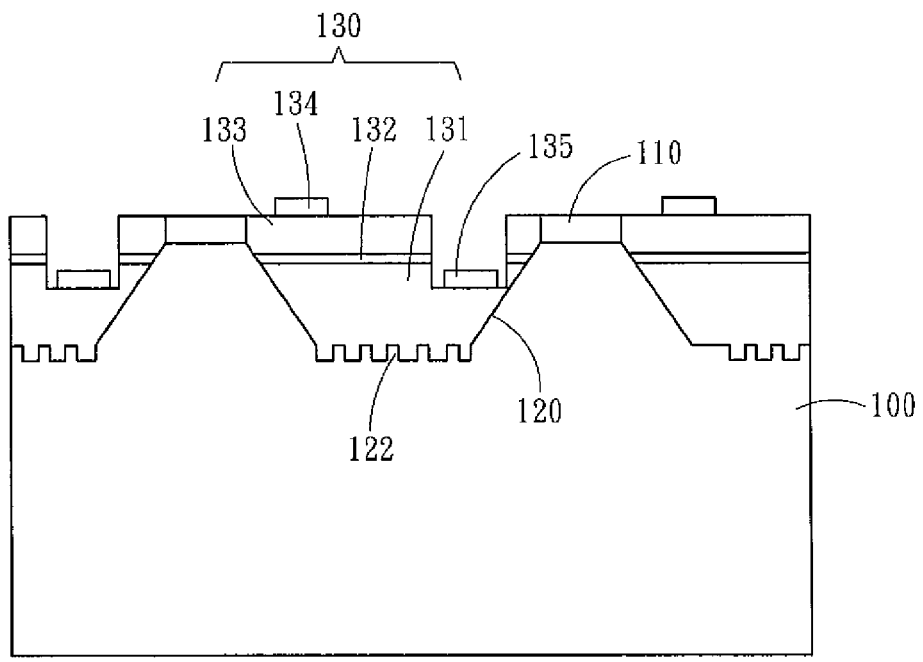
Figure 3D:
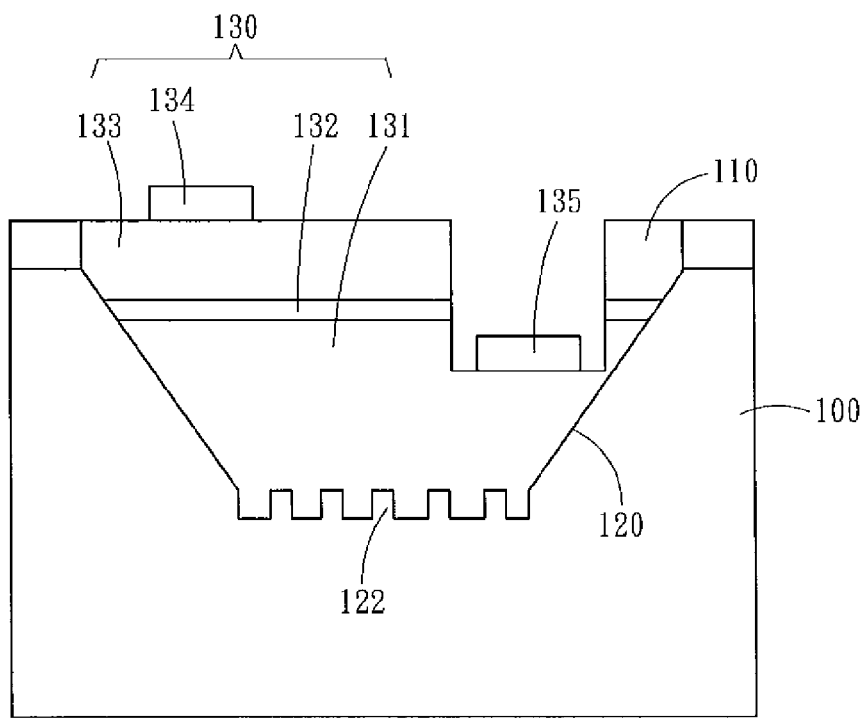

Refer to from FIG. 3A to FIG. 3D diagrams schematically showing the process of yet another method according to the present invention. This method of the present invention comprises an additional Step (b-1), which is used to etch the bottom plane 121 of the basin 120 to obtain a rugged surface 122 for increasing light extraction efficiency. This method is basically similar to the above mentioned method, but a step is added to Step (b) to pattern-etch the bottom plane 121 of the basin 120 and form a rugged surface 122. The succeeding Step (c) (shown in FIG. 3B and FIG. 3C) and Stop (d) (shown in FIG. 3D) of this method are identical to those of the above mentioned method. However, the diced LED chip shown in FIG. 3D is different from that shown in FIG. 1E in that the bottom plane 121 of the basin 120 is replaced by the rugged surface 122. The rugged surface 122 can increase the light extraction efficiency of LED.

Figure 4:
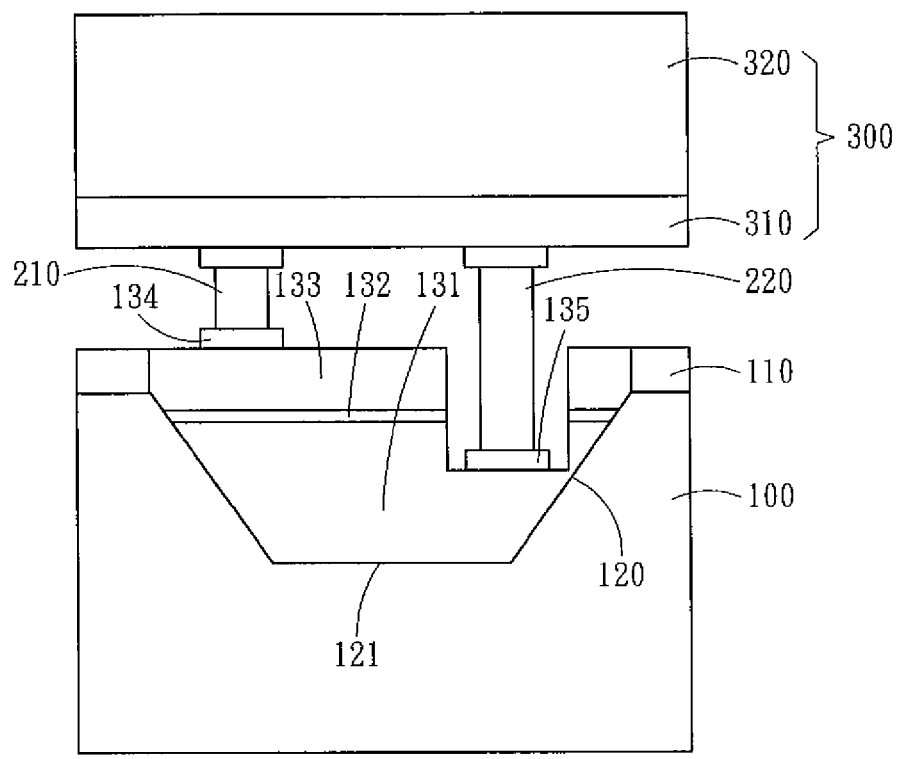
FIG. 4 is a diagram schematically showing the structure of a flip-chip LED element according to the present invention.

Refer to FIG. 4 a diagram schematically showing the structure of a flip-chip LED element according to the present invention. In this embodiment, the p-type ohmic contact electrode 134 and the n-type ohmic contact electrode 135 are respectively connected with two electric-conduction poles 210 and 220; thereby, the LED structure 130 can be electrically coupled to a heat dissipation/reflection substrate 300. The heat dissipation/reflection substrate 300 includes a reflective metal layer 310 and a heat-conduction substrate 320. One surface of the reflective metal layer 310 is electrically coupled to the LED structure 130 via the electric-conduction poles 210 and 220, and the other surface is connected to the heat-conduction substrate 320; thereby, a flip-chip LED element is obtained. The material of the reflective metal layer 310 is selected from the group consisting of gold (Au), aluminum (Al), copper (Cu), etc.; alternatively, the material of the reflective metal layer 310 may also be one combination of the above mentioned materials. The material of the heat-conduction substrate 320 is selected from the group consisting of gold (Au), aluminum (Al), copper (Cu), silicon (Si), gallium phosphide (GaP), silicon carbide (SiC), etc.; alternatively, the material of the heat-conduction substrate 320 may also be one combination of the above mentioned materials.

Figure 5A:
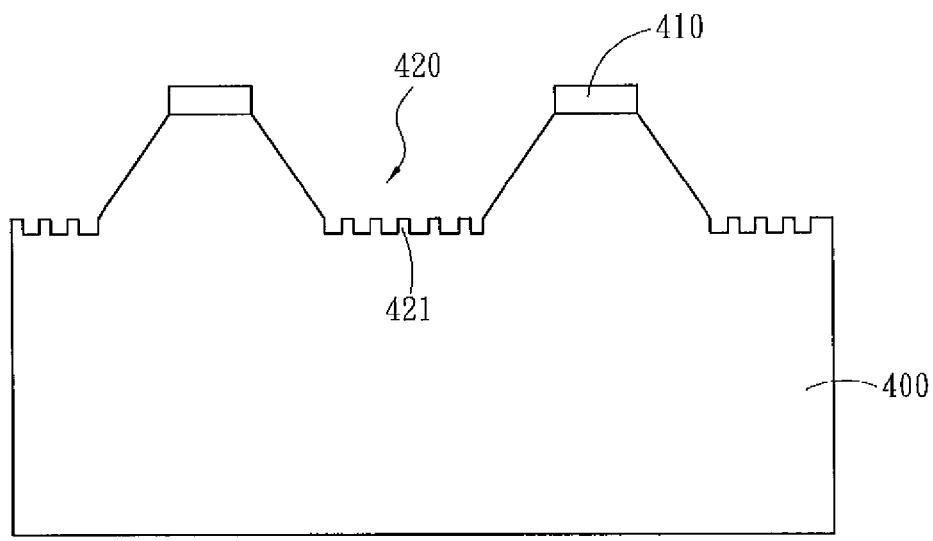
FIG. 5A to FIG. 5E are diagrams schematically showing the process of a method for fabricating an LED element with the substrate removed according to the present invention.
Figure 5B:
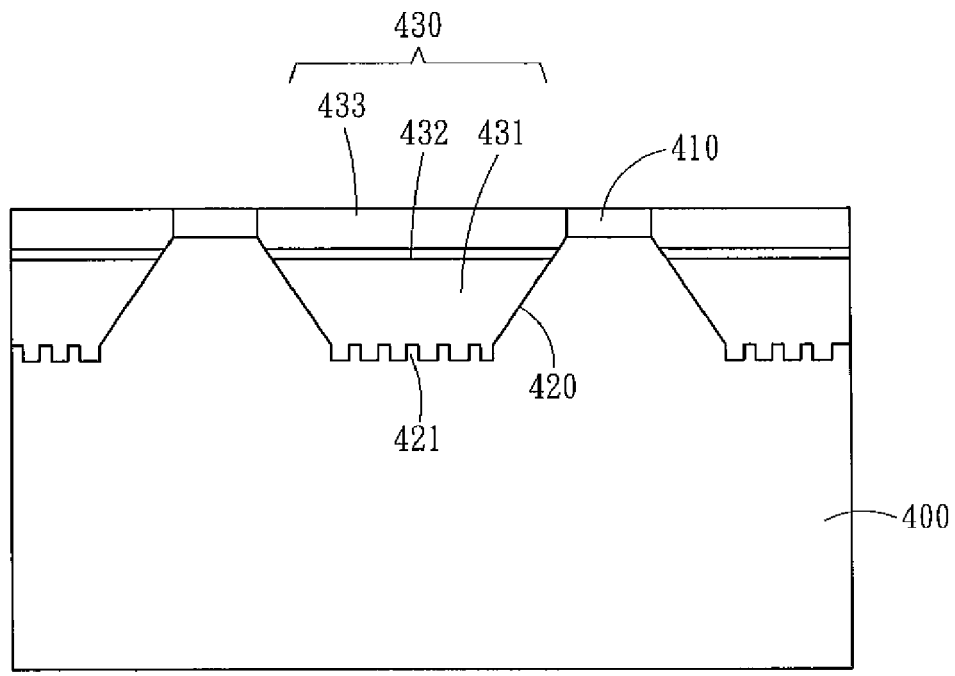
Figure 5C:
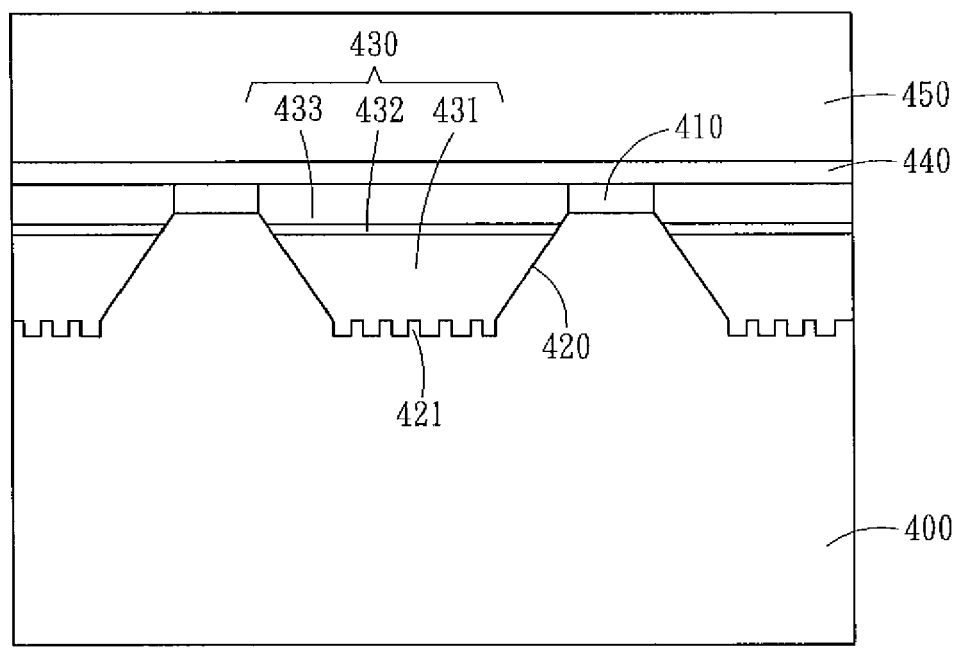
Figure 5D:
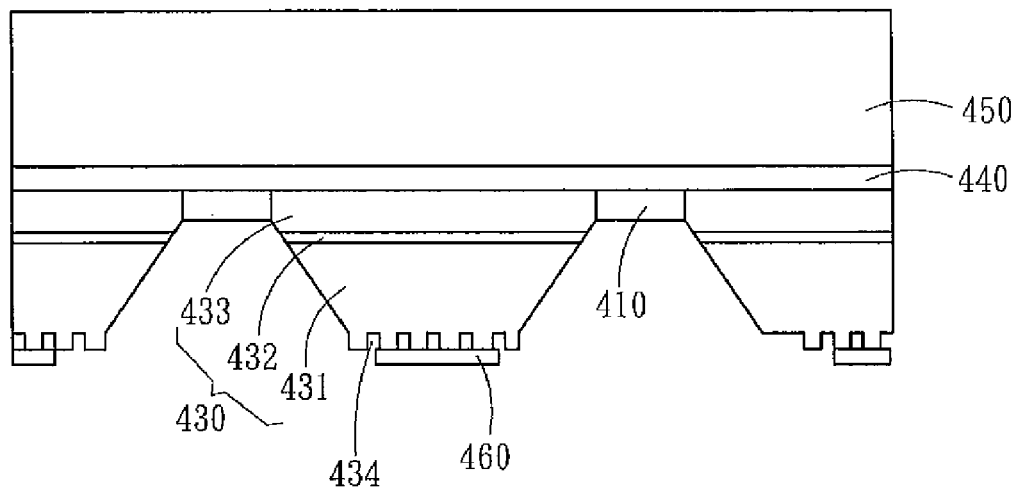
Figure 5E:
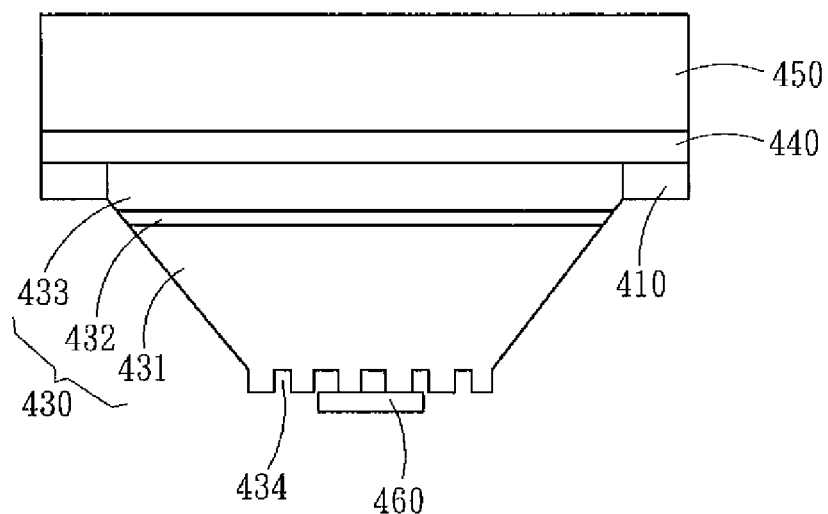

Refer to from FIG. 5A to FIG. 5E diagrams schematically showing the process of further another method according to the present invention, wherein the substrate is removed. This method of the present invention comprises:

(a) providing a substrate 400, forming a passivation layer 410 on the substrate 400 and defining a plurality of polygonal etch areas, wherein the substrate 400 may be made of sapphire, silicon carbide (SiC), silicon (Si), gallium arsenide (GaAs) or aluminum nitride (AlN), and wherein the passivation layer 410 has a width of between 5 and 50 microns, and wherein the etch area has an inner diameter of between 200 and 2000 microns and may have a shape of a rectangle, circle, triangle, star, or polygon;

(b) etching the substrate 400 to form on the etch areas a plurality of basins 420 with inclined natural crystal planes, and pattern-etching the bottom plane of the basin 420 to obtain a rugged surface 421, as shown in FIG. 5A, wherein the basin 420 has a depth of between 0.5 and 50 microns;

(c) forming an LED structure 430 on the bottom plane of the basin 420 via epitaxially growing an n-type III-V group compound layer 431, an active layer 432 and a p-type III-V group compound layer 433 in sequence, and wherein the active layer 432 is interposed between the n-type III-V group compound layer 431 and the p-type III-V group compound layer 433 and functions as a light emitting zone, as shown in FIG. 5B;

(d) vapor-depositing a p-type ohmic contact metal layer 440 on the p-type III-V group compound layer 433 of the LED structure 430, and connecting the p-type ohmic contact metal layer 440 with a heat-conduction substrate 450, wherein the material of the heat-conduction substrate 450 is selected from the group consisting of gold (Au), aluminum (Al), copper (Cu), silicon (Si), gallium phosphide (GaP), silicon carbide (SiC), etc.; alternatively, the material of the heat-conduction substrate 450 may also be one combination of the above mentioned materials;

(e) removing the substrate 400 with a wet-etching method, a dry-etching method, a laser lift off method, or a method of using different thermal expansion coefficients, wherein the substrate 400 will be spontaneously separated from the LED structure during temperature variation;

(f) vapor-depositing an n-type ohmic contact metal layer 460 on the n-type III-V group compound layer 431 of the LED structure 430, as shown in FIG. 5D, wherein the junction surface is also a rugged surface 434 because of the rugged surface 421 of the removed substrate 400;

(g) cutting and splitting the LED structure into LED chips, as shown in FIG. 5E.

The LED shown in FIG. 5E, which is fabricated according to the above mentioned method and free of the substrate 400, comprises: a LED structure 430 with inclines formed via etching a substrate 400 to obtain basins 420 having inclined natural crystal planes and a rugged bottom surface 421, and epitaxially growing on the rugged surface 421 an n-type III-V group compound layer 431, an active layer 432 and a p-type III-V group compound layer 433 in sequence, wherein the active layer 432 is interposed between the n-type III-V group compound layer 431 and the p-type III-V group compound layer 433 and functions as a light emitting zone; a p-type ohmic contact metal layer 440 formed on the p-type III-V group compound layer 433; a heat-conduction substrate 450 connected with the p-type ohmic metal layer 440; and an n-type ohmic contact metal layer 460 formed on the n-type III-V group compound layer 431, wherein the junction surface is also a rugged surface 434 because of the rugged surface 421 of the removed substrate 400. The active layer 432 may be a dual heterogeneous (DH) junction structure, a single quantum well (SQW) structure or a multiple quantum well (MQW) structure.

Those described above are only the preferred embodiments to exemplify the present invention but not to limit the scope of the present invention. Any equivalent modification or variation according to the spirit of the present invention is to be also included within the scope of the present invention.

What is claimed is:

1. A method for fabricating the light emitting diode element comprising steps:
   (a) providing a substrate, forming a passivation layer on said substrate and defining a plurality of polygonal etch areas;
   (b) etching said substrate to form on said etch areas a plurality of basins, each basin including inclined natural crystal planes inwardly extended from a surface of said substrate and a bottom plane, parallel to said surface of said substrate, connected to the inclined planes, and pattern-etching said bottom plane of said basin to obtain a rugged surface;
   (c) forming a light emitting diode structure on said bottom plane of said basin via epitaxially growing on said bottom plane in said basin an n-type III-V group compound layer, an active layer and a p-type III-V group compound layer in sequence, wherein said active layer is interposed between said n-type III-V group compound layer and said p-type III-V group compound layer and functions as a light emitting zone;
   (d) vapor-depositing a p-type ohmic contact metal layer on said p-type III-V group compound layer, and connecting said p-type ohmic contact metal layer with a heat-conduction substrate;
   (e) removing said substrate;
   (f) vapor-depositing an n-type ohmic contact metal layer on said n-type III-V group compound layer to allow the said n-type III-V group compound layer to be interposed between said n-type ohmic contact electrode and said substrate; and
   (g) cutting and splitting the total structure into light emitting diode chips.

2. The method for fabricating the light emitting diode element according to claim 1, wherein said substrate is made of sapphire, silicon carbide (SiC), silicon (Si), gallium arsenide (GaAs) or aluminum nitride (AlN).

3. The method for fabricating the light emitting diode element according to claim 1, wherein said passivation layer has a width of between 5 and 50 microns, and said etch area has an inner diameter of between 200 and 2000 microns.

4. The method for fabricating the light emitting diode element according to claim 1, wherein said etch area has a shape of a rectangle, circle, triangle, star, or polygon.

5. The method for fabricating the light emitting diode element according to claim 1, wherein said basin has a depth of between 0.5 and 50 microns.

6. The method for fabricating the light emitting diode element according to claim 1, wherein the material of said heat-conduction substrate is selected from the group consisting of gold (Au), aluminum (Al), copper (Cu), silicon (Si), gallium phosphide (GaP), silicon carbide (SiC); alternatively, the material of said heat-conduction substrate is one combination of the abovementioned materials.

7. The method for fabricating the light emitting diode element according to claim 1, wherein said substrate is removed with a wet-etching method, a dry-etching method, a laser lift off method, or a method of using different thermal expansion coefficients, wherein said substrate is spontaneously separated from said light emitting diode structure during temperature variation.

* * * * *